United States Patent
Wu et al.

(10) Patent No.: US 7,433,375 B2
(45) Date of Patent: Oct. 7, 2008

(54) LASER TRIM AND COMPENSATION METHODOLOGY FOR PASSIVELY ALIGNING OPTICAL TRANSMITTER

(75) Inventors: Hsin-Ho Wu, Santa Clara, CA (US); Peter Deane, Moss Beach, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 672 days.

(21) Appl. No.: 10/683,212

(22) Filed: Oct. 9, 2003

(65) Prior Publication Data

US 2005/0078721 A1   Apr. 14, 2005

(51) Int. Cl.
  *H01S 3/13* (2006.01)
(52) U.S. Cl. .............................. 372/29.021; 372/38.01; 372/29.01; 372/29.011; 372/26; 372/33
(58) Field of Classification Search .................. 372/26, 372/29.021, 38.01, 33, 38.02, 29.011, 29.01, 372/38
See application file for complete search history.

(56) References Cited

U.S. PATENT DOCUMENTS

| | | | | |
|---|---|---|---|---|
| 4,884,279 A | | 11/1989 | Odagiri | 372/29 |
| 4,903,273 A | | 2/1990 | Bathe | 372/38 |
| 5,019,769 A | * | 5/1991 | Levinson | 372/31 |
| 5,073,838 A | * | 12/1991 | Ames | 361/103 |
| 5,245,690 A | * | 9/1993 | Aida et al. | 385/142 |
| 5,479,424 A | | 12/1995 | Sakuyama | 372/26 |
| 5,761,230 A | | 6/1998 | Oono et al. | 372/38 |
| 5,974,063 A | | 10/1999 | Yoshida | 372/38 |
| 6,169,618 B1 | | 1/2001 | Higashino | 359/187 |
| 6,188,498 B1 | | 2/2001 | Link et al. | 359/187 |
| 6,400,737 B1 | * | 6/2002 | Broutin et al. | 372/20 |
| 6,452,953 B1 | | 9/2002 | Ushirozawa | 372/20 |
| 6,480,314 B1 | | 11/2002 | Kobayashi | 359/187 |
| 6,836,493 B2 | | 12/2004 | Mahowald et al. | |
| 6,862,302 B2 | * | 3/2005 | Chieng et al. | 372/29.02 |
| 6,891,867 B2 | * | 5/2005 | Serizawa | 372/29.02 |
| 6,909,731 B2 | * | 6/2005 | Lu | 372/29.01 |
| 6,947,455 B2 | * | 9/2005 | Chieng et al. | 372/29.021 |
| 6,956,408 B2 | * | 10/2005 | Schrodinger et al. | 327/66 |
| 2002/0093999 A1 | * | 7/2002 | Tanaka | 372/38.01 |
| 2002/0196595 A1 | * | 12/2002 | Ciancio | 361/93.1 |

(Continued)

*Primary Examiner*—Minsun Harvey
*Assistant Examiner*—Delma R Fordé
(74) *Attorney, Agent, or Firm*—Beyer Law Group LLP

(57) ABSTRACT

A method embodiment of the invention includes a scheme for trimming and compensation of a laser emitter in a fiber optic link. A laser emitter is provided. Also a reference optical power value is determined using data models of laser emitter performance generated by statistical analysis of sample population of lasers that are similar to the subject laser emitter. The performance of the subject laser is measured and qualified optical power levels for the subject laser emitter are determined using the reference operating power value and measured performance of the subject laser emitter. The driving current of the subject laser emitter is adjusted to compensate for changes in temperature until the optical power of the subject laser emitter obtains a desired qualified optical power level. Related methods of determining qualified optical power levels for a laser emitter in a fiber optic link are also disclosed. As are methods of determining a reference optical power value for a laser emitter to be coupled in a fiber optic link. Fiber optic links capable of trimming and compensation in open and closed loop configurations are also disclosed.

10 Claims, 9 Drawing Sheets

U.S. PATENT DOCUMENTS

| | | | |
|---|---|---|---|
| 2003/0007525 A1* | 1/2003 | Chen | 372/31 |
| 2004/0051938 A1* | 3/2004 | Chan et al. | 359/337.1 |
| 2004/0264518 A1* | 12/2004 | Chang | 372/29.021 |
| 2005/0078722 A1* | 4/2005 | Wu et al. | 372/38.01 |

* cited by examiner

LASER TRIM AND COMPENSATION METHODOLOGY FOR PASSIVELY ALIGNING OPTICAL TRANSMITTER

TECHNICAL FIELD

The invention described herein relates generally to laser diode control methods and apparatus for use in an optical transmission system. In particular, the invention relates to methods and structures for quickly trimming a laser transmitter and providing accurate temperature compensation for the transmitter.

BACKGROUND

Laser diodes are used in optical transmission systems as light emitters. FIG. 1 illustrates a conventional laser diode behavior. Conventional laser diodes generate a characteristic optical power curve 110, three ranges can be distinguished. A pre-threshold portion A having a slight slope, in which there is no emission yet of coherent light. A "threshold area" B, which has a "knee" in the characteristic curve. Finally, a steeper portion of the characteristic curve includes a linear portion 111 having a constant slope, in which there is a linear correlation between the drive current and the optical power output.

As the temperature of the diode increases, its behavior changes. For example, the second laser power curve 120 depicts the optical performance of the same laser diode at a higher temperature. The characteristic curve appears to shift to the right (as indicated by the arrow). Additionally, the slope of the linear portion commonly becomes shallower. Also, the threshold current values increase.

Thus, when the operating point is set on a diode at one temperature it is valid for the diode only as long as it remains at the same temperature. However, in ordinary course of operation diode temperatures can fluctuate significantly. As shown in FIG. 1 this leads to significant changes in diode operating parameters (e.g., threshold current, optical power output, diode slope efficiency, as well as many other significant operating parameters). This makes calibration and operating points set at one temperature invalid at other temperatures. What is needed is method and apparatus for trimming and compensating for the effects of changing temperature. Moreover, it would be desirable to have a method and apparatus capable of utilizing previously obtained laser characterization data to facilitate the set up and compensation schemes of the present invention.

SUMMARY OF THE INVENTION

In accordance with the principles of the present invention, the invention includes, among other things, a robust electrical connection and methods for its fabrication.

In one method embodiment, scheme for trimming and compensation of a laser emitter in a fiber optic link is disclosed. The method involves providing a subject laser emitter and determining a reference optical power value for the subject laser emitter using data models of laser emitter performance generated by statistical analysis of a population of lasers that are similar to the subject laser emitter. The performance of the subject laser is measured and qualified optical power levels for the subject laser emitter are determined. Wherein the qualified optical power levels for the subject laser emitter are determined using the reference operating power value and measured performance of the subject laser emitter. The driving current of the subject laser emitter is adjusted to compensate for changes in temperature until the optical power of the subject laser emitter obtains a desired qualified optical power level.

In another embodiment a method of determining qualified optical power levels for a laser emitter in a fiber optic link is disclosed. The method involves providing a laser emitter. A reference optical power value for the laser emitter is determined and the performance of the provided laser emitter is measured. Qualified optical power levels for the provided laser emitter are determined by modifying the reference target operating power using the measurements of the provided laser.

In yet another embodiment, a method of determining a reference optical power value for a laser emitter to be coupled in a fiber optic link is disclosed. This method involves providing laser performance information derived from a population of lasers that are similar to said laser emitter. The method involves providing coupling efficiency information concerning the coupling efficiency of the population of lasers with a fiber optic link that is similar to the provided fiber optic link. A predetermined set of user specified performance parameters are provided. Then a reference optical power value that incorporates the laser performance information, the coupling efficiency information, and the performance parameters is determined.

In yet another embodiment, a laser emitter device suitable for coupling with an optical fiber in a fiber optic link is disclosed. The device includes a semiconductor laser emitter, a temperature sensor for detecting the temperature of the semiconductor laser emitter and producing a sensor output signal associated with the detected temperature, and a lookup table having stored values for current information associated with temperature. The device further includes a laser driver that receives the temperature dependent current information from the table and uses the current information to provide a driving current to the semiconductor laser emitter so that the laser emits an optical signal having a desired optical power.

These and other aspects of the invention will be disclosed in greater detail in the following detailed description.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is specifically pointed out that the depictions in the drawings are not necessarily to scale.

DETAILED DESCRIPTION OF THE INVENTION

Figure 1:
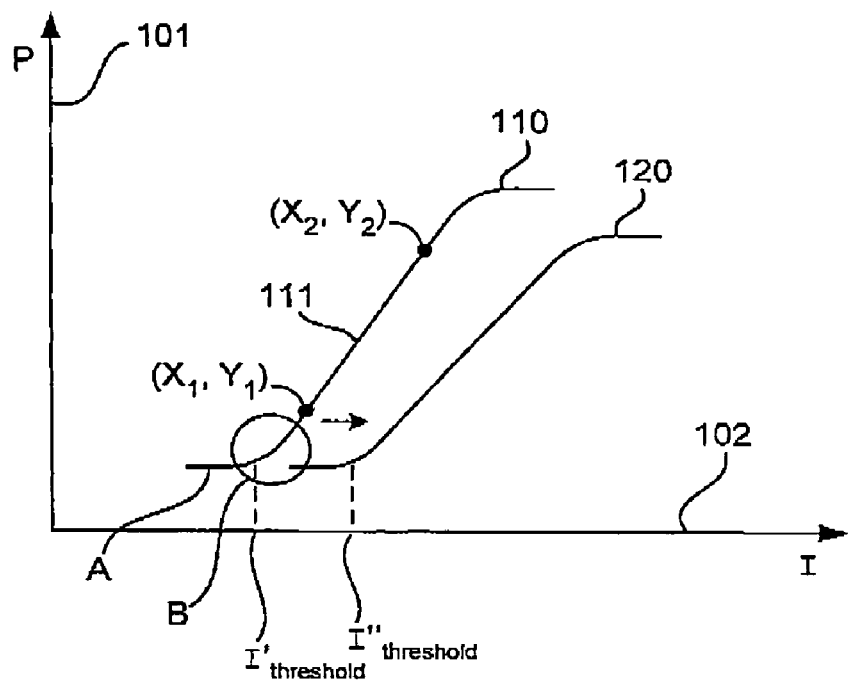
FIG. 1 is a graphical depiction semiconductor laser output power as a function of bias current at two example temperatures.

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Aspects of the invention teach methodologies for obtaining a reference operating power value that can be used to set operating points for a specified set of laser diodes that are to be operated over a predetermined temperature range. Advantageously, the reference operating power value can be obtained without measuring the specific properties of the particular laser being set up. All that is needed to determine the reference optical power value for the particular laser being set up is previously obtained laser performance information, laser power coupling efficiency information, and a predetermined set of user specified performance parameters. In particular, the laser performance information is derived from a sample population of lasers that are substantially similar to the particular laser being set up. The coupling efficiency information concerns the coupling efficiency of a sample population of lasers that are substantially similar to the provided laser emitter and a fiber optic link of the type to be used.

One aspect of the invention includes a fast optical transceiver trimming (FTC) scheme for reliably trimming a passively aligned optical transmitter. Embodiments of the invention include an optical emitter (typically, a laser diode) coupled to an optical fiber using an optical link. In accordance with the principles of the invention, such embodiments do not require active alignment or other positional adjustments of the emitter with respect to the fiber in order to project the necessary power level into the fiber. Rather, the desired power level is attained by setting a correct initial power level (trimming the laser) and continuously adjusting the laser modulation current (compensation) to adjust for temperature dependent variation in laser power. Such a scheme, implemented in accordance with the principles of the invention, can accommodate optical power variation factors due to: laser characteristics, manufacturing processes, temperature changes, quantization effects, passive alignment tolerances, and optical and/or mechanical coupling misalignments (for example, due to passive alignment) between a laser emitter and an associated optical fiber in a fiber optic link.

One particular benefit realized by preferred embodiments of the invention is the ability to take advantage of previously acquired laser performance data and optical power coupling efficiency data. Importantly, embodiments of the invention can take advantage of pre-assembly measurements and calculations to set a reference operating power value (ROPV) which can be used in conjunction with a small number of optical power measurements to set qualified optical power levels that can be used to determine operating points for in an optical transmitter (i.e., a laser emitter). Additionally, a temperature dependent optical power compensation mechanism is disclosed so that the optical power output and signal quality can meet a set of pre-defined operating parameters.

Embodiments of the invention can set the operating points of laser emitters using only a few basic measurements concerning the manufactured laser emitters. These basic measurements can be performed in a fully pre-programmed and automatic manner. Additionally, trim and compensation embodiments in accordance with the principles of the invention provide flexibility in selecting different operating points for the optical emitters so that a user can emphasize various operating parameters (e.g., reliability, optical signal quality, and power consumption) in order to optimize the lasers for a given task. Device embodiments constructed in accordance with the principles of the invention can be controlled using microprocessors or dedicated ASIC's.

Embodiments of the invention can make extensive use of previously determined laser performance information derived from statistical analysis of sample populations of lasers. Commonly, laser emitters of any given type are mass-produced having substantially similar operating characteristics. In order to characterize these lasers representative samples are taken for analysis. For example, if 100,000 1 mW VCSEL lasers are manufactured, a representative sample population of the lasers comprising, for example, 5,000 of such lasers can be taken. This sample population can be tested to determine many of the operational characteristics of the manufactured lasers.

Many characteristics of the lasers can be analyzed in this fashion. Many laser characteristics, including slope efficiency (SE) and threshold current ($I_{threshhold}$ or $I_{th}$) can be determined and statistically analyzed for each type of manufactured laser. For example, both slope efficiency (SE) and threshold current ($I_{th}$) vary with temperature. Consequently, in order to calculate appropriate operating conditions for a laser and maintain a stable laser optical output power over a range of operating temperatures, laser performance is analyzed with respect to temperature. In particular, it is important to determine the effect that changing temperature has on, for example, laser bias current and modulation current.

FIG. 1 graphically depicts the output power of a semiconductor laser as a function of bias current. Laser performance can be depicted as laser power curves (110, 120) which map optical output power 101 of the laser as a function of bias current 102. A first laser power curve 110 depicts the threshold current ($I'_{th}$) at which the laser first begins to produce optical power. The first laser power curve 110 includes a linear portion 111 (sometimes referred to as a diode line) wherein the optical power and the bias current are in a linear relationship with respect to one another. The linear portion 111 of the curve can be described by its slope efficiency (SE) which is the slope of linear portion 111 of the curve 110. As the temperature of the diode increases, its behavior changes. For example, the second laser power curve 120 depicts the optical performance of the same laser at a higher temperature. For one, the curve appears to shift to the right (as indicated by the arrow). The threshold current ($I''_{th}$) increases and the slope efficiency is reduced.

As shown, the optical output power of laser diodes is affected by threshold current ($I_{th}$) and slope efficiency (SE) characteristics and both vary with temperature. Models characterizing laser diode behavior with respect to temperature can be obtained in a number of different manners. Essentially, laser power and bias currents are measured at different temperatures and after a number of different lasers have been measured, a fairly representative model of laser behavior can be generated.

Figure 2:
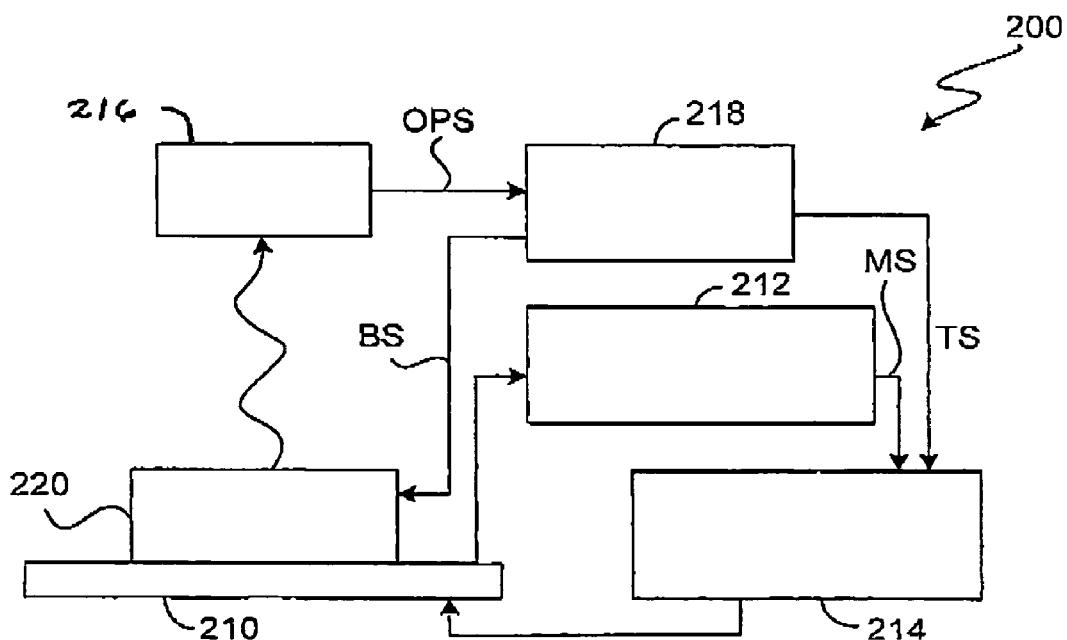
FIG. 2 is a block diagram that illustrates an example of a test set up that can measure threshold currents and slope efficiencies for a reference laser diode over a desired range of temperatures in accordance with the principles of the present invention.

FIG. 2 shows a simplified block diagram that illustrates an example of a test set up 200 that can be used to measure threshold currents ($I_{th}$) and slope efficiencies (SE) for a reference laser diode over a desired range of temperatures. The depicted set up 200 includes a laser diode 220 attached to a base structure 210 and an adjustable cooling/heating source 214. A temperature detector 212 is used to detect the temperature of the laser diode 220 during testing. In operation, temperature detector 212 detects the temperature of base structure 210 (and thereby the temperature of the laser diode 220), and outputs a measured temperature signal MS. The adjustable cooling/heating source 214 receives a temperature signal TS from the controller 218 that associated with a desired temperature for the base structure 210, and receives the measured temperature signal MS (which is associated with the temperature of the base structure 210). In response, cooling/heating source 214 chills or heats base structure 210 to obtain the temperature defined by the temperature signal TS.

Further, test set up 200 includes an optical power detector 216 and a controller 218. Optical power detector 216 detects the optical power of a light beam and outputs an optical power signal OPS associated with the magnitude of the received optical power from the laser diode 220. The optical power signal OPS is received by controller 218. The controller 218, in turn, outputs the temperature signal TS to adjustable cooling/heating source 214 to set the temperature of base structure 210, and a bias signal BS to a reference laser diode 220 to control the magnitude of the bias current ($I_B$) input to the laser diode 220. The controller 218 also receives the optical power signal OPS and, based on the received optical power, determines the $I_{th}$ for the reference laser diode 220 at each measured temperature.

Figure 3:
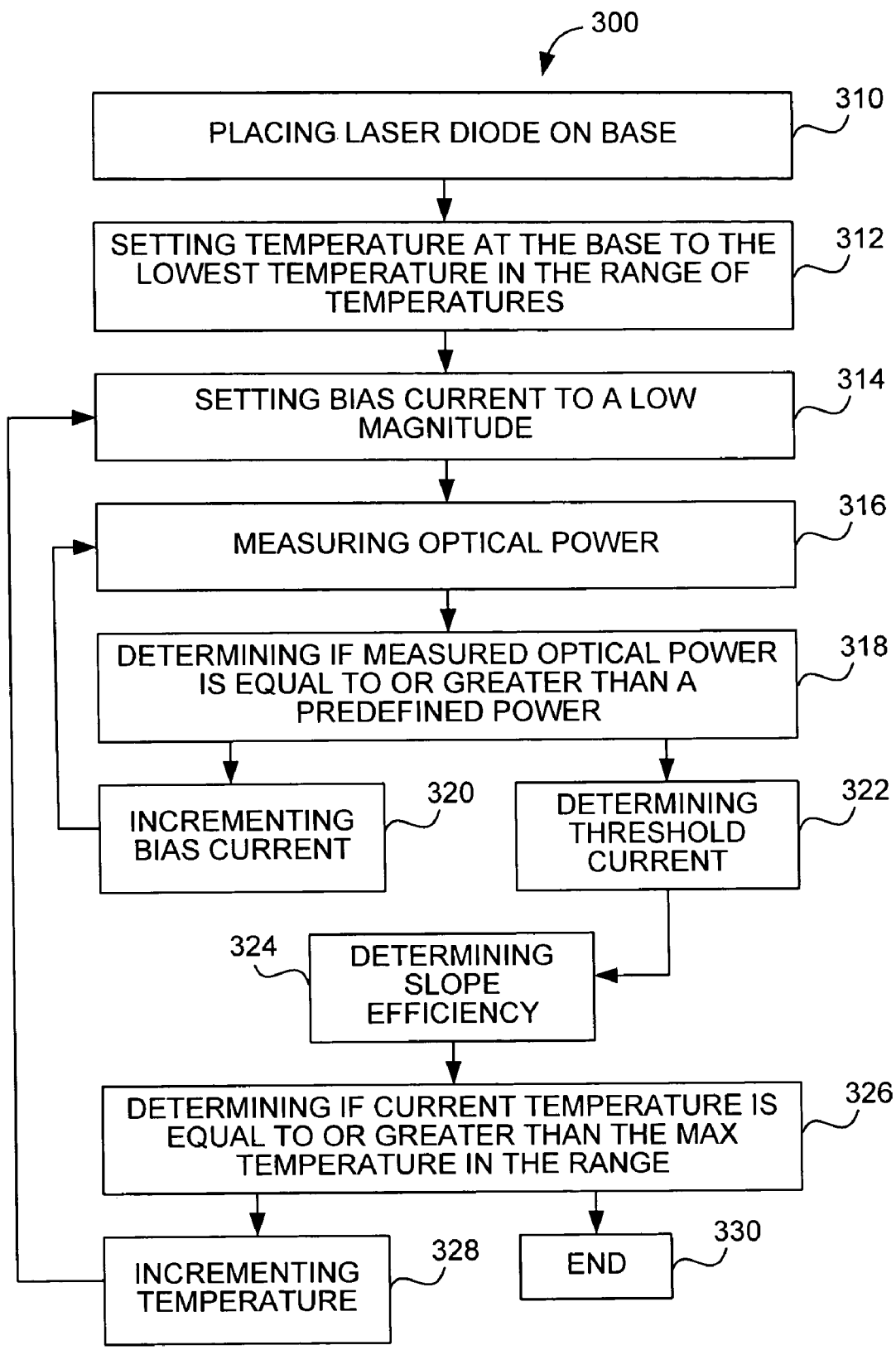
FIG. 3 is a flow diagram that illustrates a method embodiment for obtaining laser diode test information in accordance with the principles of the present invention.

FIG. 3 depicts a flow diagram 300 that illustrates one example of a suitable method of operating test set 300 up in accordance with the present invention. The method 300 begins at Step 310 by placing measured laser diode 220 on base structure 210. The temperature of the laser diode is regulated by the temperature of base structure 210. The measured laser diode 220 is aligned with optical power detector 216, and connected to receive the input bias signal BS. At Step 312 the controller 218 outputs the temperature signal TS with a value that sets the temperature of base structure 210 equal to the lowest temperature in the range of temperatures. Next, method 300 moves to Step 314 where controller 218 outputs the input bias signal BS with a value that causes the bias current to have a low magnitude. After this, method 300 moves to Step 316 to measure the optical power of the light output by measured laser diode 220, and then to Step 318 to determine if the measured optical power is equal to or greater than a predefined power level. If the measured optical power is less than the predefined power level, method 300 moves to Step 320 where controller 218 changes the input bias signal BS to cause the bias current to be incremented by a predetermined amount. Method 300 then returns to Step 316 to measure the optical power of the light output by measured laser diode 220. Method 300 continues to loop through Steps 320, 316, and 318 until the measured optical power is equal to or greater than the predefined optical power for measured laser diode 220.

When the measured optical power is equal to or greater than the average optical power of measured laser diode 220, method 300 moves to Step 322 to determine the threshold current ($I_{th}$) of measured laser diode 220. The $I_{th}$ can be determined using any of a number of different methodologies known to persons having ordinary skill in the art. Example conventional methods include algorithms for detecting a "knee" in a curve. Such algorithms are well known to those having ordinary skill in the art.

After $I_{th}$ has been determined, method 300 moves to Step 324 to determine the slope of the diode line DL. As shown in FIG. 1, the slope can be graphically determined by using any two points on the linear portion of the operating curve for the laser diode. For example, the slope of curve 110 can be determined by using a first point ($X_1, Y_1$) on the linear portion 111 that is greater than $I_{th}$, and a second point ($X_2, Y_2$) on the linear portion 111. This will yield a slope or slope efficiency (SE)=$(Y_2-Y_1)/(X_2-X_1)$.

Once the slope of the linear portion has been determined, the method moves to Step 326 to determine if the current temperature is equal to or greater than the maximum temperature of the desired range of temperatures. If the current temperature is less than the highest temperature of the range, method 300 moves to Step 328 to change the temperature signal TS to a value that causes cooling/heating source 214 to incrementally increase the temperature of base structure 210 by a predetermined amount.

The method then returns to Step 314 where controller 218 outputs the input bias signal BS with a value that causes the bias current to have the low magnitude. The method continues to loop until Ith and the slope have been determined for each temperature increment within the range of temperatures. When, at Step 326, the temperature is equal to or greater than the maximum temperature in the desired range of temperatures the method moves to Step 330 to end.

Figure 4:
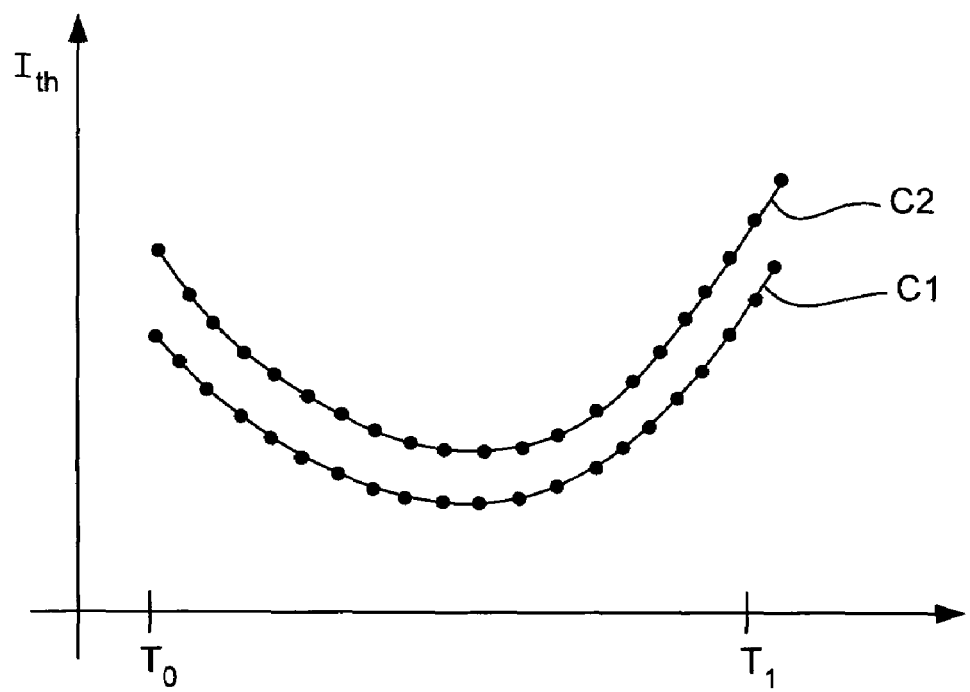
FIG. 4 graphically depicts a relationship between laser diode threshold current and temperature in accordance with the present invention.

FIG. 4 graphically depicts an exemplary relationship between $I_{th}$ and temperature in accordance with the present invention. As shown in FIG. 4, a first curve C1, depicting $I_{th}$ versus temperature, can be plotted for each temperature increment in the range of temperatures ($T_0$ for the lowest temperature in the range and $T_1$ for the highest temperature in the range) for the measured laser diode. Curve C1 has a wide "U" shape indicating that the $I_{th}$ falls as the temperature increases to a center point, then increases as the temperature increases beyond the center point. Commonly, each laser diode has its own characteristic U-shaped curve (e.g., another example diode is depicted using the second curve C2). Typically, a lot of diodes will be manufactured and a number of these diodes will be selected as a sample population. These sample diodes will be measured and used to characterize the lot of manufactured diodes. This can be done by for each lot of diodes (or for any other suitable grouping of diodes). In this way the laser diodes can be characterized.

Figure 5:
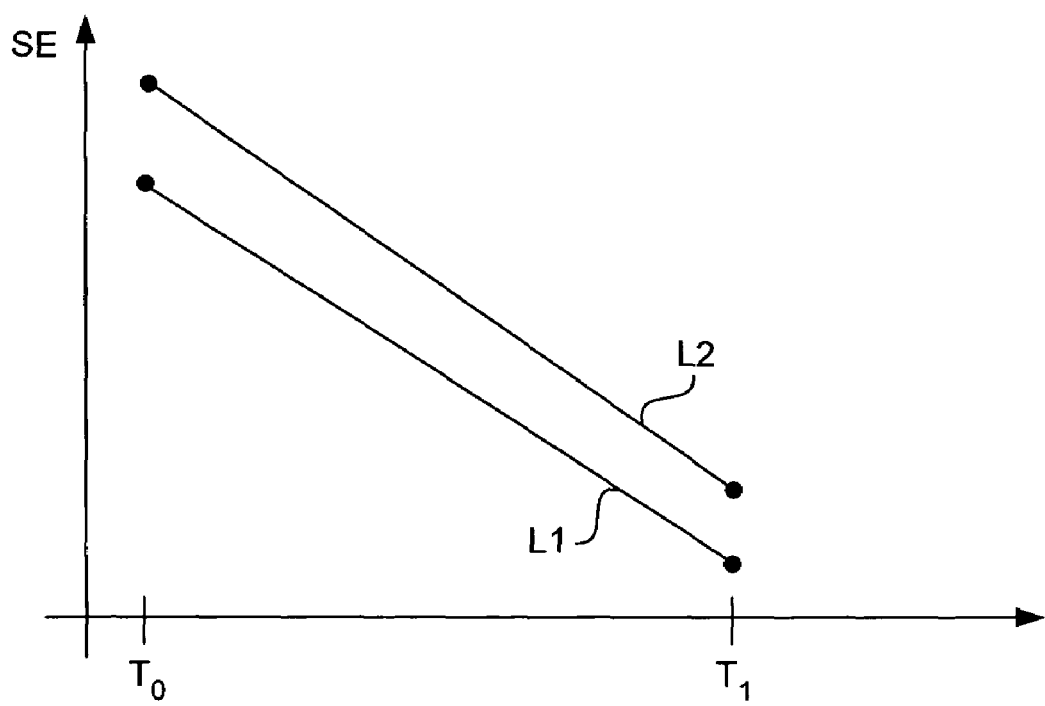
FIG. 5 graphically depicts a relationship between laser diode slope efficiency and temperature in accordance with the present invention.

Additionally, the manufactured diodes can be characterized with respect to slope efficiency (SE). FIG. 5 is an exemplary graphical depiction of slope efficiency (SE) versus temperature in accordance with the present invention. As shown in FIG. 5, slope efficiency versus temperature curve L1 can be plotted once a linear portion has been determined for each temperature increment in the range of temperatures for a measured diode. Thus, each measured diode can be expressed in terms of its current $I_{th}$ versus temperature profile (for example, C1 FIG. 4) and its slope efficiency versus temperature profile (for example, L1 FIG. 5).

After repeating $I_{threshold}$ and SE measurements over a predefined temperature range for a sufficient number of laser diodes, statistical analysis can be performed on the measured data for a measured diode population. Such statistical analysis can be used to derive values for the mean, standard deviation, maximum, and minimum for the measured $I_{th}$ and SE. These as well as other statistically related values can be used to determine operating points for optical transmitters in accordance with the embodiments of the invention (examples of which are described in further detail hereinbelow). The accumulated data and the associated statistical results can also be used to construct laser characterization models. These data models can be used to characterize laser performance. For example, the data can be used to construct data models of temperature versus $I_{th}$ or SE to describe laser performance. For example, FIGS. 4 and 5 shows possible $I_{th}$ and SE data models that can estimate $I_{th}$ and SE temperature behaviors based on sampling of selected laser diodes from production runs.

Many other additional factors can be considered in determining operating points for laser emitters in accordance with the principles of the invention. As is known to those with ordinary skill, optical networks include many optical nodes. Each node can include a fiber optic link that couples the laser emitter to an associated optical fiber. At each link there exists an optical connection between a transmitter (e.g., a laser) and an associated optical fiber. Moreover, at each link there exist certain optical coupling inefficiencies. These inefficiencies describe, grossly, an accumulation of mechanical and optical misalignments as well as other coupling imperfections. The type and configuration of laser transmitter, the optical and mechanical designs of the link, and a variety of other factors (all well known to persons having ordinary skill in the art) affect the optical power level that will be coupled into the associated optical fiber. In order to maintain a desired optical power level projected into the associated optical fiber, the effects of the coupling inefficiencies and other possible power variations should be known and accommodated by methods incorporating the principles of the invention.

The coupling efficiencies for a given design can be determined using a number of methods known to persons having ordinary skill in the art. For example, once the transmitter laser diode is characterized (e.g., the threshold currents ($I_{th}$) and slope efficiencies (SE) are measured over a range of temperatures) the laser diode can be driven at a selected bias current (set above the $I_{th}$) and the output power from the laser can be measured. The output power difference between the power produced by the laser transmitter and the power coupled into the fiber is a measure of the coupling efficiency.

Figure 6:
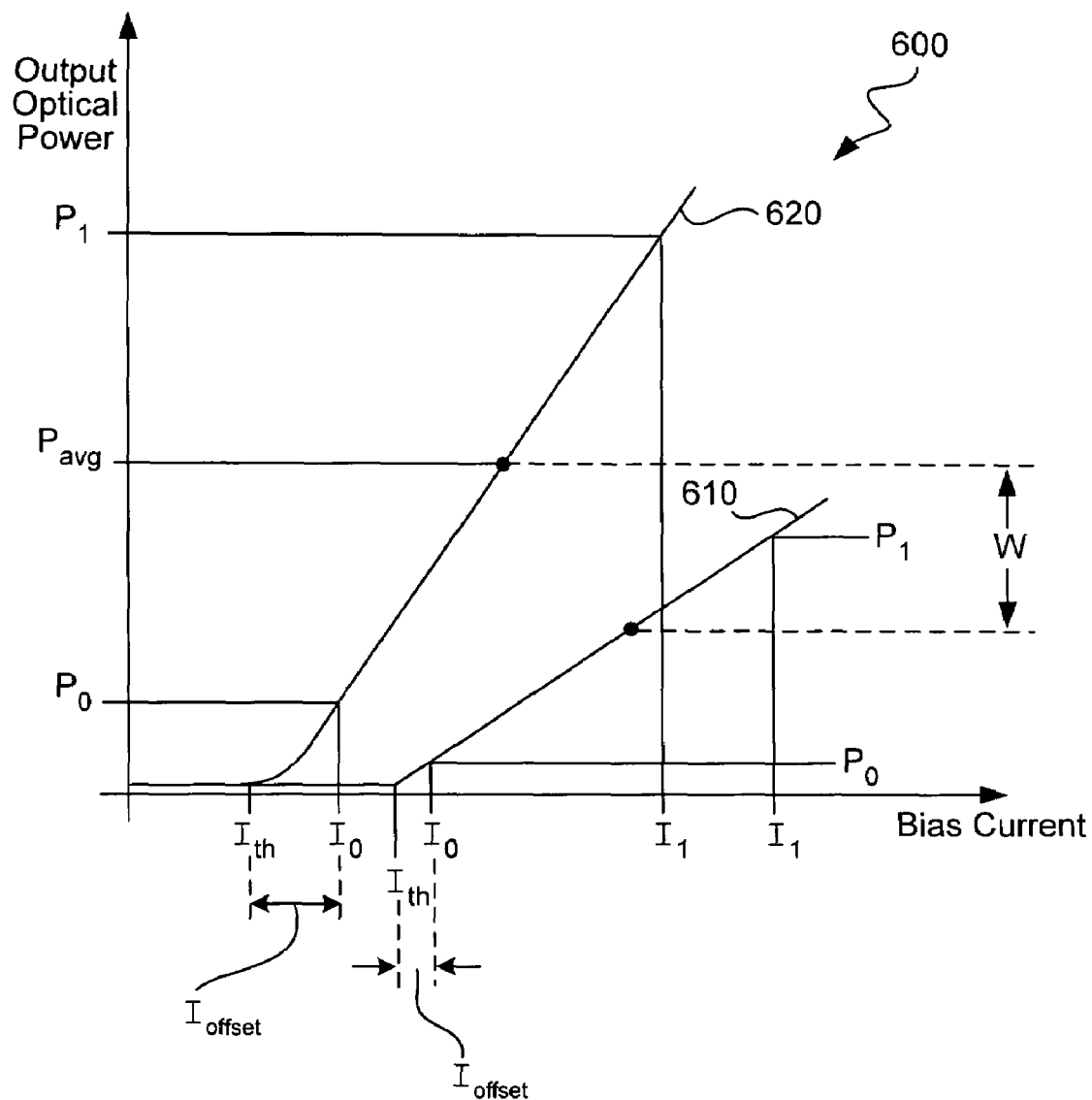
FIG. 6 is a simplified graphical depiction of the optical output of a laser device as compared to bias current that can be used to illustrate certain aspects of the invention.

FIG. 6 is a simplified graphical illustration of the optical output of a laser device. The diagram 600 depicts the optical output power of a VCSEL laser device at two different operating temperatures. The diagram is similar to that depicted in FIG. 1. A first low temperature power curve 610 depicts the relationship between bias current and output optical power. This curve 610 is characteristic of laser performance at temperatures near the lower end of an operational temperature range (e.g., at room temperature). Another, second high temperature power curve 620 depicts the relationship between bias current and output optical power at a higher temperature near the top of the operational temperature range.

Definitions

With continuing reference to FIG. 6, the following definitions will aid in the explanation of the embodiments of the invention.

$$P_0 = (I_0 - I_{th}) \cdot SE = I_{offset} \cdot SE \qquad \text{Eqn. 1}$$

$$P_1 = (I_1 - I_{th}) \cdot SE \qquad \text{Eqn. 2}$$

$$P_{avg} = \frac{P_0 + P_1}{2} \qquad \text{Eqn. 3}$$

$$ER = \frac{P_1}{P_0} \qquad \text{Eqn. 4}$$

$P_0$ defines the optical power level at which the laser is considered to be at a "low" power output state corresponding to a logical "0" or "off" in a binary transmission. $P_0$ is the optical "zero" for the laser. SE is the slope efficiency of a laser when the laser driving current is in the linear region of laser performance. $I_{threshold}$ (or $I_{th}$) is the threshold current for the laser where the laser begins to emit an optical signal. $I_{offset}$ sets a minimum difference between $I_0$ and $I_{th}$. $I_{offset}$ is set so that $I_0$ is sufficiently above $I_{th}$ thereby reducing jitter in optical output signal. $I_0$ is a driving current associated with $P_0$.

$P_1$ is the minimum power at which the laser is considered to be at a "high" power output state that normally corresponds to a logical "1" or "on" in a binary transmission. $I_1$ is a driving current associated with $P_1$.

$P_{avg}$ is the average power for the laser in a specified power range. As depicted, $P_{avg}$ is the average of $P_1$ and $P_0$. Additionally, W defines a specified power range window. The window W is a boundary condition that describes the acceptable range of power variation over an operational temperature range. Additionally, window W can be used as a user defined boundary condition that describes a desired range of power variation over an operational temperature range. As depicted here, W is the power range for $P_{avg}$ over a predetermined temperature range. For example, the window W can define an acceptable power range between two $P_{avg}$ values (i.e., the acceptable power difference between a high temperature $P_{avg}$ and a low temperature $P_{avg}$) for a diode laser. Generally, the window W is a user specified performance parameter commonly pre-specified to accommodate certain system minimum performance requirements. For example, the window W can be used to accommodate optical link budget, diode reliability concerns, and production yield concerns.

For example, laser diodes are less efficient at high temperature because the threshold current is higher and the slope efficiency is decreased. Consequently, at high temperature the laser is driven with higher current to reduce the drop in optical output power. This is reflected in a smaller window W. Also, if the optical link budget is tight, the W can be reduced at the cost of requiring a higher driving current. Thus, W can be used to accommodate the optical link budget. An optical link budget defines the optical power levels and signal quality needed to accommodate signal transmission requirements in an optical system. Such requirements take into consideration factors including, but not limited to, link length, jitter, bit error rate (BER) as well as a number of other related factors commonly known to persons having ordinary skill in the art.

Also, laser diode reliability (laser diode lifetime) is closely related to the average driving current ($I_{avg}=(I_1+I_0)/2$). Higher driving currents reduce laser diode reliability (lifetime). Thus, for a given optical link budget, a lower driving current can be used to improve reliability (i.e. lead to longer laser diode lifetimes). This can be controlled by adjusting the window W. For example, given a specified optical link budget, an increased window W value permits a laser diode to operate using a smaller bias current at higher temperatures. Consequently, such a diode will have a longer operational lifetime (better reliability). However, the increased window W can result in a laser diode transmitting at a lower optical power. This can result in increased BER and reduce the link distance. Additionally, an increased window W can affect production yield because some less efficient laser diodes may not be qualified for a given design. By studying the tradeoffs between reliability, yield, and link performance, a desired window W value can be determined. Additional factors can affect the choice of W value. As is known to persons having ordinary skill in the art laser diode operation is affected by current. For example, for a given optical link budget and extinction ratio (ER), it is possible that $I_1$ or the average current ($I_{avg}$) may be too high. This has undesirable effects that are especially prevalent in less efficient laser diodes (e.g. lasers having small SE). For example, the reliability of such diodes can be significantly reduced. Also, laser driving circuitry may place limits on the maximum laser diode driving current. By controlling the power window W, $I_1$ and average current can be adjusted to accommodate the specific laser diode and circuitry characteristics. This can improve production yield.

Another useful user specified performance parameter is the extinction ratio (ER) which specifies a ration between the power "on" to the power "off". The ER is the ratio of $P_1$ to $P_0$ as indicated in Eqn. 4 above. Generally, the ER is pre-specified to accommodate certain system minimum performance requirements. For example, an ER of about 9 dB or greater is preferred in most system.

Having disclosed and explained some basic terms. Preferred method embodiments of the invention are disclosed for determining a reference optical power value, setting qualified optical power values, and adjusting laser power to maintain a desired laser output optical power.

Once a batch of lasers is manufactured, selected lasers of the batch are measured to characterize laser performance. Embodiments of the invention can take advantage of this previously obtained laser performance data and laser coupling efficiency data to set operating points for individual lasers selected from the batch of lasers. Method embodiments disclosed herein below can be used to determine a reference operating power value. This reference operating power value can be used as a reference point for setting up individual production devices. The reference operating power value can be used to set up laser devices so that such devices can demonstrate optimum yield. For example, by adjusting the window W value (which is selected to accommodate the optical link budget, reliability, and yield) the window W value can be selected to maximize yield. Moreover, the window W value can be selected to increase the reliability of the diodes. For example, a given population of diodes can be set to have similar operating currents which results in a family of diodes having relatively similar operational lifetimes (reliability). Thus, for a given production run a high degree of reliability stability can be provided. All of these characteristics can be accommodated while incorporating previously determined laser performance information, previously determined coupling efficiency information, and user specified performance parameters. The determination of the reference operating power value enables a laser device to be set up using a minimum amount of measurements while still meeting the desired laser performance specifications. Additionally, embodiments of the invention include methods for adjusting laser optical output power to compensate for the effects of temperature changes.

One method of determining a reference optical power value (ROPV) for a laser emitter to be coupled with an optical fiber in a fiber optic link is described. A particularly advantageous feature of the disclosed embodiment is that same ROPV applies to all lasers in the subject population and does not require any measurements of the particular laser emitter at issue. Previously obtained laser performance information, derived from a sampling of a population of lasers, is provided. Example methods for obtaining such laser performance information have been described herein. It will be appreciated by those having ordinary skill in the art that many other methods of data collection and laser characterization can be utilized in accordance with the invention. This information provides laser performance information that models laser performance characteristics and provides useful statistical information that can be used to further characterize laser performance. The particular laser being set up is of like kind to that described by the previously obtained laser performance data (i.e., the laser being set up is substantially similar to the lasers described by the laser performance data).

Additionally, previously obtained coupling efficiency information is provided. The coupling efficiency information can include statistical information concerning the coupling efficiency of the lasers to an optical fiber in an optical link. In general, the coupling efficiency information concerns coupling between laser emitters and optical links that are of a like kind to the laser and optical link being set up in accordance with the principles of the invention. Coupling efficiencies are commonly on the order about 4 dB (decibel) ±1 dB. However, the inventors contemplate that the invention can be practiced with a wider range of coupling efficiencies.

Also, a predetermined set of user specified performance parameters are provided. Such user specified performance parameters can be used to encompass a number of system parameters and laser operating parameters. Such user specified performance parameters can include a predetermined value for ER (extinction ratio). Such ER's are preferably in the range of about 9-14 dB. Another user specified performance parameter includes the power window W described hereinabove. One example of a useful power range for such a window W is about 1 dB or less. A predetermined value for $I_{offset}$ can also be supplied. The value for $I_{offset}$ can be set at any value, but is preferably set in the range of about 0.3-0.5 mA. Additionally, an optional predetermined quantization error value can be provided. The quantization error value is used to compensate for errors induced in an offset current value ($I_{offset}$) caused by calculation errors in the logic systems used to process information. Such errors can include floating point errors as well as other system generated errors. A typical value for such a quantization error value is on the order of about ±5% (depending on the digital-to-analog resolution). Another user specified performance parameter includes a predetermined operational temperature range over which the laser is intended to operate. The inventors point out that although selected values for the above parameters have been provided, the present invention can be practiced using other values for the specified parameters. Also, the invention can be practiced using other parameters.

Once the above information is provided, an appropriate reference optical power value can be calculated. This calculation incorporates the laser performance information, the coupling efficiency information, and at least some of the performance parameter information.

Method for Determining ROPV

Method for Determining ROPV

Figure 7A:
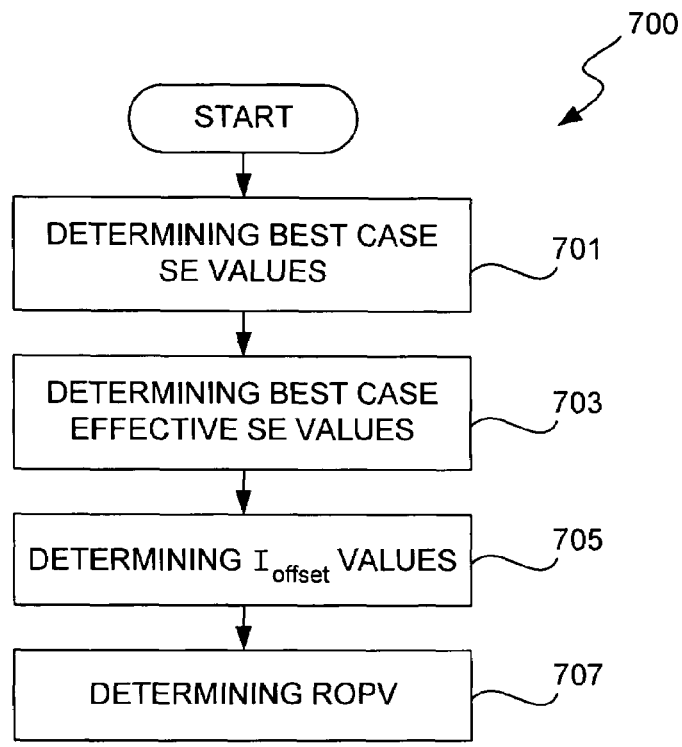
FIG. 7(a) is a flow diagram illustrating a method embodiment for determining a reference operating power value in accordance with the principles of the present invention.

FIG. 7(a) is a simplified flow diagram that illustrates one embodiment for calculating reference operating power value (ROPV) in accordance with the principles of the invention. The ROPV is an estimate of a best-case average power for a population. It is a baseline onto which other measurements and calculations can be references. The illustrated flow diagram 700 disclosed one generalized method of determining an ROPV. Best-case slope efficiency (SE) values are determined from a data model (Step 701). Best-case effective SE values are determined by modifying the SE values using coupling efficiency (CE) information (Step 703). $I_{offset}$ values are determined (Step 705). An ROPV is determined using the best-case effective SE values and the $I_{offset}$ values in conjunction with user specified performance parameters (Step 709).

Figure 7B:
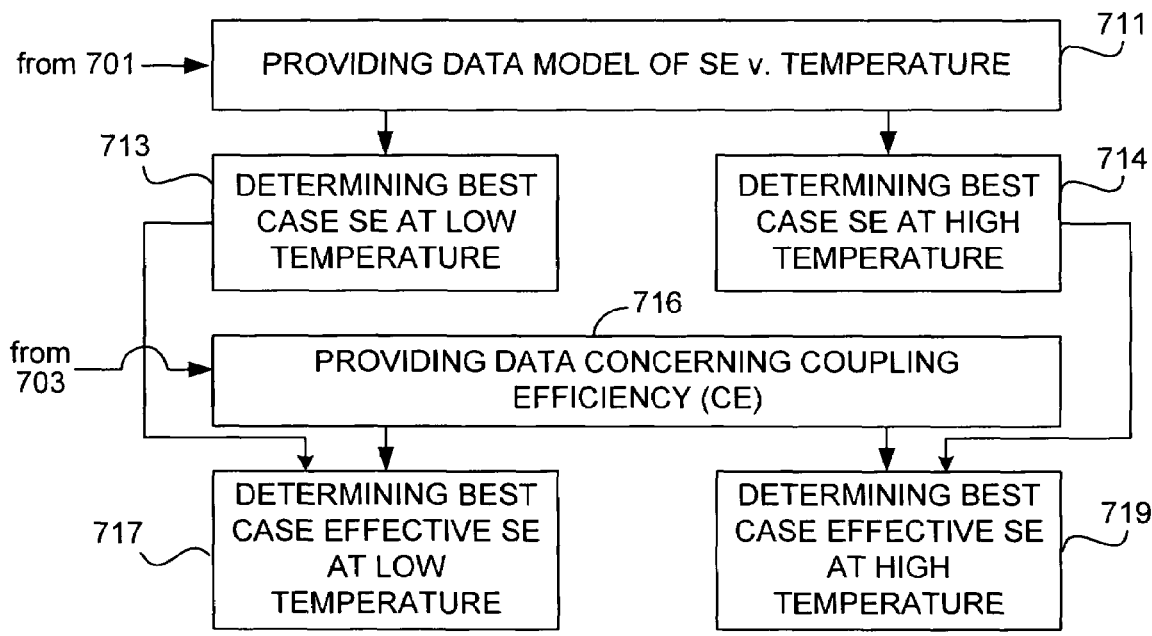
FIG. 7(b) is a flow diagram illustrating an aspect of the method embodiment depicted in FIG. 7(a) in accordance with the principles of the present invention.

FIG. 7(b) is a simplified flow diagram depicting an approach for determining best-case slope efficiency (SE) values (such as shown in Step 701 of FIG. 7(a)) and determining best-case effective SE values (i.e., Step 703). A data model describing SE as a function of temperature is provided (Step 711). Such models and methods for generating such models have been previously described herein (for example, see the descriptions concerning FIG. 5).

Figure 7C:
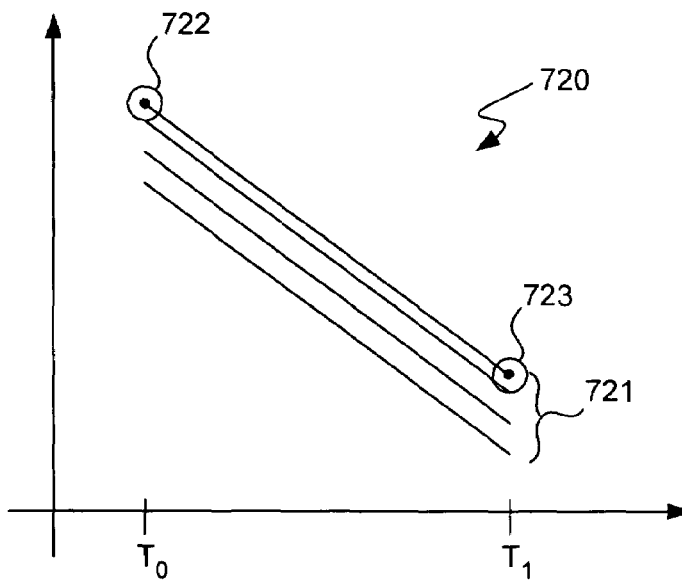
FIG. 7(c) is a simplified graphical depiction of the slope efficiency data as compared to temperature that can be used to facilitate certain aspects of the invention.

Added reference is hereby made to FIG. 7(c) which is a simplified schematic depiction of a data model 720 of temperature versus slope efficiency (SE). Such a model is generated using data collected from a test population of measured lasers taken from a larger population of manufactured lasers of a like kind. The SE of each tested laser is graphed with respect to temperature over a defined temperature range. $T_0$ defines the low end of the temperature range and $T_1$ defines the high end of the temperature range. The temperature range is typically the operational temperature range for the laser. Commonly, $T_0$ is defined as the lower end of the operational range of temperatures (e.g., about −10° C.), with $T_1$ being defined at the upper range of operational temperatures (e.g., about 90° C.). The SE at each temperature is determined for each laser tested. Generally, the behavior of such lasers is linear with FIG. 7(c) depicting four exemplar SE curves 721. Using the provided data model, a best-case SE at low temperature is determined (Step 713). The best-case SE is that SE having the highest value. For example, the data model 720 is used to determine that data point 722 is the best case SE value (generally the highest SE values are found at the lowest temperature). Additionally, a best-case SE at high temperature is determined (Step 714). Data point 723 depicts the best-case SE at high temperature (the highest temperature in the range $T_1$).

A data model of coupling efficiency (CE) between a laser and an associated optical link is also provided (Step 716). Analysis of the CE model can be used to determine a best-case coupling coefficient for the coupling of lasers and the optical link. Once the best-case coupling coefficient is determined it is applied to the best-case SE at low temperature (Step 717) to determine a best-case effective SE at low temperature. This is essentially an optimal coupling of laser to optical fiber for the system and represents the maximum amount of optical power deliverable by the system. Also, the best-case coupling coefficient is applied to the best-case SE at high temperature (Step 719) to determine a best-case effective SE at high temperature. These effective SE values can be used to determine a ROPV.

Returning to FIG. 7(a), appropriate offset current values ($I_{offset}$) are determined (Step 705). $I_{offset}$ is the difference between the laser diode threshold current $I_{th}$ and an associated zero-level bias current $I_0$. High values for $I_{offset}$ improve signal quality because they reduce jitter and demonstrate better rise and fall time for the optical signal produced by the laser.

Figure 7D:
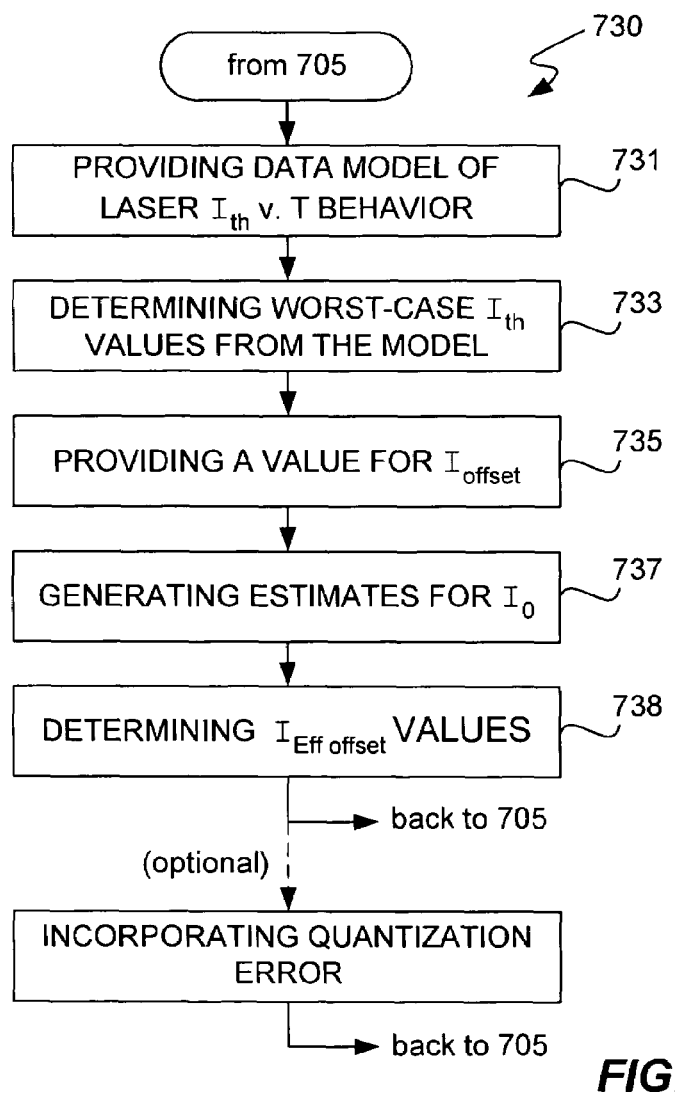
FIG. 7(d) is a flow diagram illustrating a method embodiment for determining an appropriate offset current value in accordance with the principles of the present invention.
Figure 7E:
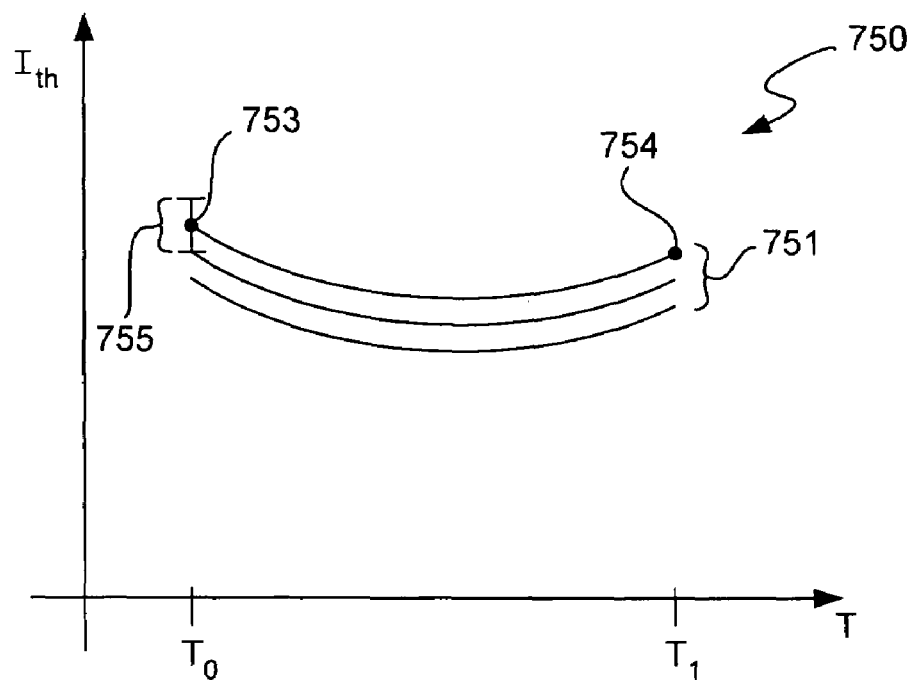
FIG. 7(e) is a simplified graphical depiction of the threshold current data as compared to temperature that can be used in accordance with the principles of the invention.

FIG. 7(d) is a simplified flow diagram 730 depicting an approach for determining appropriate $I_{offset}$ values (Step 705). A data model describing threshold current ($I_{th}$) as a function of temperature is provided (Step 731). Such models have been previously described herein, for example, the model described in FIG. 4. Added reference is hereby made to FIG. 7(e), a simplified schematic depiction of a data model 750 describing $I_{th}$ versus temperature. As previously described, such a model is generated using data collected from a sample population of tested lasers taken from a larger population of lasers of a like kind. The $I_{th}$ of each measured laser of the sample population is graphed with respect to temperature over a defined temperature range. $T_0$ defines the low end of the temperature range and $T_1$ defines the high end of the temperature range. The temperature range is typically the operational temperature range for the laser. Commonly, $T_0$ is defined as about −10° C., with $T_1$ being defined at the upper range of operational temperatures (e.g., about 90° C.). The $I_{th}$ at each temperature is determined for each laser tested. Generally, the behavior of such lasers is "U-shaped" with FIG. 7(e) depicting three exemplar $I_{th}$ curves 751.

Returning to FIG. 7(d), the worst-case $I_{th}$ values are determined (Step 733). The worst-case $I_{th}$ is an $I_{th}$ having the highest $I_{th}$ value. Using the provided data model (e.g., as in FIG. 7(e)), worst-case values for $I_{th}$ are determined. Typically, these values are determined at either end of the temperature range. Thus, a worst-case low temperature $I_{th}$ value is depicted at point 753. Also, a worst-case high temperature $I_{th}$ value is depicted at point 754.

A default offset current $I_{offset}$ value is also provided (Step 735). This can be a predetermined value set by the user. In one embodiment, a value of about 0.3-0.5 mA is used. The worst-case values for $I_{th}$ can be used with the $I_{offset}$ default value to generate estimates (Step 737) of a zero-level bias current $I_0$ in accordance with the following equation.

$$I_0 = I_{th} + I_{offset} \qquad \text{Eqn. 5}$$

This process is somewhat recursive as described herein below. For example, the default value for $I_{offset}$ is added to worst-case $I_{th}$ at low temperature to yield a low temperature estimate of zero-level bias current $I_0$. Additionally, the default value for $I_{offset}$ can be added to worst-case $I_{th}$ at high temperature to yield a high temperature estimate of zero-level bias current $I_0$. These estimates of zero-level bias current $I_0$ are then used to determine more accurate values for $I_{offset}$ (Step 738) referred to herein as effective offset ($I_{Eff\,offset}$). The $I_{Eff\,offset}$ is determined by subtracting the worst-case $I_{th}$ values (including a maximum error margin) from the estimates of zero-level bias current $I_0$. For example, at low temperature, an estimate of zero-level bias current $I_0$ has been determined in the manner disclosed hereinabove. The low temperature value for $I_{th}$ is already known from the data model (e.g., 753 of FIG. 7(e)). Additionally, the measurements and model used to generate the estimate of $I_{th}$ are subject to some error margin. Generally, this error margin is determined statistically. The greatest error margins are found at either end of the temperature range (e.g., at $T_0$ and $T_1$). With reference to FIG. 7(e), the maximum error margin 755 for point 753 is depicted. Thus, a low temperature value for $I_{th}$ (753)(including the maximum error margin) is subtracted from the low temperature estimate of zero-level bias current $I_0$ to determine a low temperature $I_{Eff\,offset}$ (also referred to as $I_{Eff\,offset\,@\,low\,temp}$). An analogous calculation is made to determine a high temperature $I_{Eff\,offset}$ (also referred to as $I_{Eff\,offset\,@\,high\,temp}$). These estimates of error are very useful because during manufacturing it is common that measurements are taken at room temperature only. Thus, the $I_{th}$ vs. temperature curves are typically generated from measurements taken at room temperature. As a result, the modeled values at the high temperature ($T_1$) and low temperature ($T_0$) ends of the curves are subject to greater degrees of error. Thus, it is important to compensate for this error.

Additionally, the $I_{Eff\,offset}$ values can optionally be modified to take into account quantization errors induced by the logic circuitry associated with the determination of reference operating power value (ROPV). Such modification incorporates and corrects for the maximum possible quantization error. Quantization error is the error margin induced by conversion processes. Each quantization error reflects the specific implementation schemes of the hardware and software involved. For example, if 8-bit DAC (digital-to-analog conversion) is used to convert laser bias current, quantization error is the difference between the original value (in 8-bit format) and the converted analog value. Typically, a worst case quantization error is used in calculations of ROPV.

Figure 7F:
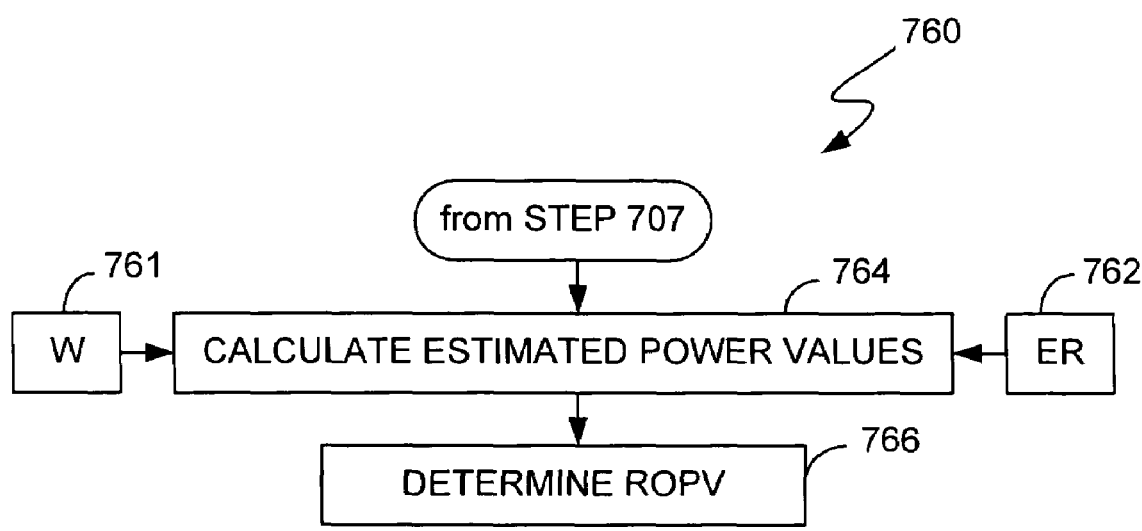
FIG. 7(f) is a flow diagram illustrating aspects of the method embodiment depicted in FIG. 7(a).

Once values have been determined for $I_{Eff\,offset\,@\,low\,temp}$, $I_{Eff\,offset\,@\,high\,temp}$, SE at low temperature, and SE at high temperature the ROPV can be determined. Returning to FIG. 7(a), the ROPV is determined at Step 707. One method for determining an ROPV is described in conjunction with the flow diagram 760 of FIG. 7(f). A predetermined power window W (as described herein above with respect to FIG. 6) is provided (Step 761). This is usually a user specified value. However, the value can be selected to be in compliance with other system requirements. Predetermined power window W values are usually in the range of about 1 dB. Also, a predetermined worst-case extinction ratio (ER) value is provided (Step 762). The ER is one of a set of predetermined user specified performance parameters. A suitable worst-case ER value is typically in the range of about 9 dB to about 13 dB with 13 dB being most preferred (note that in general higher values for ER are better). Once these values have been provided, estimated power values can be calculated (Step 764). The estimated power values are typically estimates of average power for the lasers when they are operated at a low temperature in the temperature range.

The following is a discussion of methods for calculating such estimated power values. A first estimated average power value ($P_{avg1}$) is calculated as follows:

$$P_{avg1} = \frac{(ER+1)*I_{Eff\_offset\_@Low\_Temp}*SE_{Effective@Low\_Temp}}{2} \quad \text{Eqn. 6}$$

Wherein ER is the above discussed worst-case ER. $I_{Eff\,offset\,@\,Low\,Temp}$ is the above discussed effective offset current determined at low temperature. $SE_{Effective\,@\,Low\,Temp}$ is the above discussed best-case effective slope efficiency determined at the low temperature in the temperature range.

A second estimated average power value ($P_{avg2}$) is also calculated as follows:

$$P_{avg2} = \frac{(ER+1)*I_{Eff\_offset\_@High\_Temp}*SE_{Effective@High\_Temp}*W}{2} \quad \text{Eqn. 7}$$

Wherein ER is the above discussed worst-case ER. $I_{Eff\,offset\,@\,High\,Temp}$ is the above discussed effective offset current determined at high temperature. $SE_{Effective\,@\,High\,Temp}$ is the above discussed best-case effective slope efficiency determined at the high temperature in the temperature range. And wherein W is the specified window defining the power range between the average power at the highest temperature in the temperature range and the average power at the lowest temperature in the temperature range. As discussed above, the W factor enables the second estimate to incorporate factors such as the optical link error budget, laser diode reliability, and production yield.

The reference operating power value (ROPV) is then determined from the estimated power values (Step 766). In general, the higher value of either $P_{avg1}$ or $P_{avg2}$ is selected and used as the ROPV. This ROPV is used in laser modulation current calculations and temperature compensation schemes described hereinbelow.

Method for Determining qOPL

Method for Determining qOPL

Figure 8A:
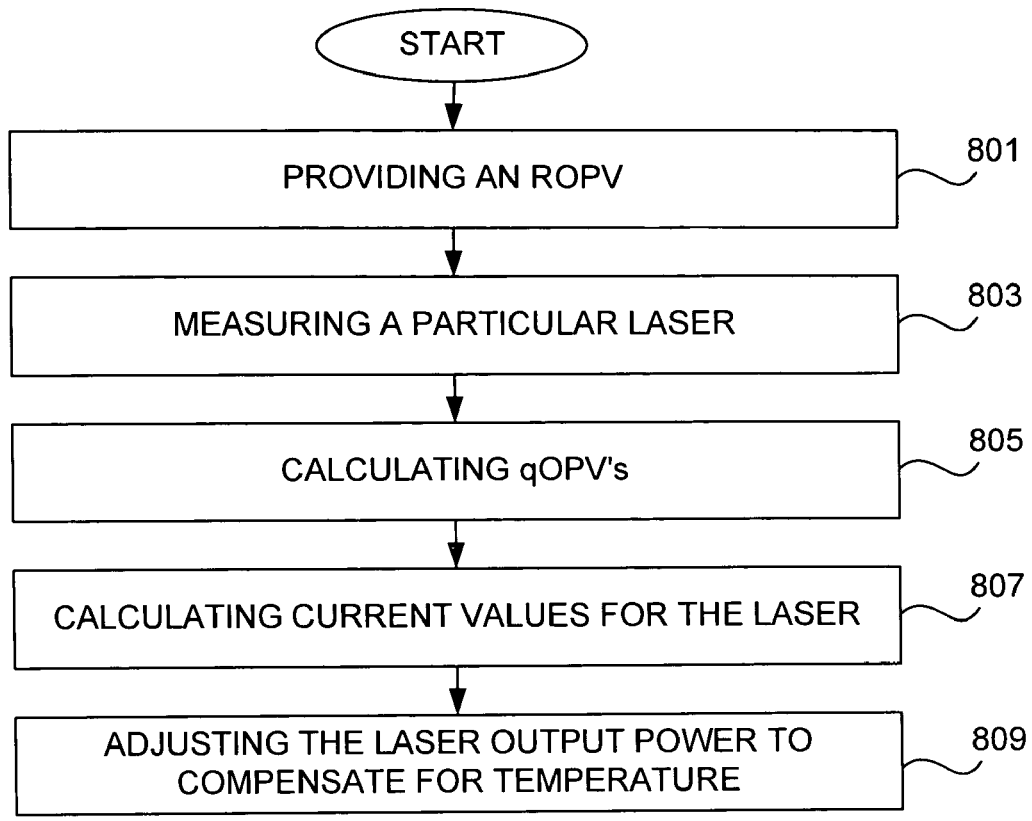
FIG. 8(a) is a flow diagram describing a method embodiment for implementing a laser emitter trimming and temperature compensation scheme in accordance with the principles of the invention.

Once the ROPV is determined it can be used to implement a temperature compensation scheme in accordance with the principles of the invention. One approach to implementing such a scheme is described with respect to the flow diagram illustrated in FIG. 8(a). In Step 801 a reference operating power value (ROPV) is provided. This is the same ROPV calculated in FIG. 7(a). Once the ROPV is determined it can be used to implement a temperature compensation scheme in accordance with the principles of the invention. One approach to implementing such a scheme is described with respect to the flow diagram illustrated in FIG. 8(a). In Step 801 a reference operating power value (ROPV) is provided. This is the same ROPV calculated in FIG. 7(a). Measurements of the particular laser emitter in question are then made and used to determine a measured $I_{th}$ value and measured slope efficiency (SE) value for the laser (Step 803). Using the SE measurements qualified optical power level values (qOPL) are generated over a range of temperatures (Step 805). These values can also be stored, for example, in a table. Current values for the measured laser are also determined (Step 807). These values can also be stored, for example, in a table. The laser power is adjusted until the optical power produced by the laser reaches a qOPL suitable for the temperature of the laser (Step 809). This qOPL can be continuously adjusted depending on the changing temperature of the laser.

Figure 8B:
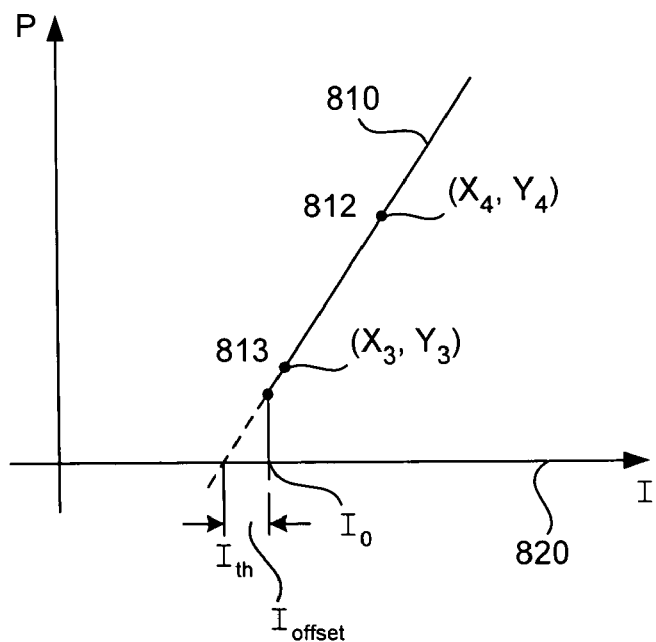
FIG. 8(b) is a graphical depiction of a laser power curve associated laser optical power with bias current in accordance with the principles of the invention.

Once the ROPV is generated (Step 801) the optical transmitter (which includes a laser emitter) is measured (Step 803). In this step a laser emitter is provided and power measurements are taken in the linear portion of the laser power curve. At least two measurements of optical power and current are taken. It is advantageous if one of the data points measured includes the $I_{th}$ value for the measured laser. These measurements can be taken while the laser is at any temperature but are conveniently taken while the laser is at room temperature. Referring to FIG. 8(b), a linear portion 810 of a laser curve is depicted with two measured data points 812, 813. The power and bias current values can be measured to generate a slope efficiency (SE) for the measured laser. This SE value reflects the SE of the measured laser at a known temperature. This can be used to generate a qualified optical power level (Step 805) using the following equation:

$$qOPV_{at\_Ti} = ROPV \frac{SE_{measured\_at\_Ti}}{SE_{Best}} \qquad \text{Eqn. 8}$$

Wherein $qOPL_{at\_Ti}$ is a qualified optical power level at the measured temperature $T_i$. The ROPV is the calculated reference operating power value (determined by the disclosed process above) and $SE_{Best}$ is a best-case value for slope efficiency. Generally, $SE_{Best}$ is the $SE_{Effective\ @\ Low\ Temp}$ value discussed herein above with respect to Eqn. 6. $SE_{Best}$ is a measured value for SE of the particular laser being tested. $SE_{Best}$ is measured for the laser at the known temperature $T_i$. This calculation produces a power level value that is an estimate of the desired operating point for the laser at the temperature $T_i$. Additionally, because the qOPL is determined at some temperature in the temperature range (i.e., at $T_0$), the power window W can be used to generate different qOPL's for each temperature in the range (Step 805). This can be achieved, in one embodiment, through interpolation of extrapolation from known values. For example, if the power window W is specified as 1 dB and the $SE_{measured\ at\ Ti}$ is measured at the lowest temperature in the range (i.e., $T_0$) we know that the measured slope efficiency (i.e., $SE_{measured\ at\ T_0}$) is likely the highest qOPL obtainable for the system. Additionally, it is known that the lowest qOPL occurs at the highest temperature (i.e., $T_1$) of the temperature range. Also, the chosen power window W constrains the lowest qOPL to be no less than 1 dB below the highest qOPL (i.e., that determined at $T_0$). Thus, for any given temperature (from $T_0$ to $T_1$) a corresponding qOPL can be determined. This is advantageous because it only requires a single SE measurement.

Additionally, the previously described process is used to determine the ROPV (i.e. using the lowest temperature case) and then generate a $ROPV_{at\_Ti}$, (which is the ROPV value at temperature $T_i$). The $ROPV_{at\_Ti}$, can be determined using the ROPV (determined as described herein above) and a predetermined W value. Advantageously, the temperature $T_i$ is selected as a temperature that matches the device manufacturing environment (typically, room temperature, but other temperatures can be selected). The $ROPV_{at\_Ti}$ can then be used to determine a $qOPV_{at\_Ti}$ at a temperature $T_i$. For example, once the $ROPV_{at\_Ti}$ is determined at temperature $T_i$, a model of temperature versus slope efficiency is used to determine a best-case slope efficiency value at $T_i$. Also, the device being set-up is measured and a slope efficiency value at $T_i$ is determined. The measured slope efficiency value at $T_i$ is divided by the best-case slope efficiency value at $T_i$ determined from the model. This value is multiplied by the $ROPV_{at\_Ti}$ to determine a $qOPV_{at\_Ti}$.

Returning to FIG. 8(*a*) at Step 807 the zero-level bias current $I_0$ can be determined. FIG. 8(*b*) can be used to illustrate one simple method for determining $I_0$ for the measured laser diode. Using the linear portion 810 of the measured laser, the linear portion 810 of the laser curve is extended downward (the dashed line) until it crosses the bias current axis 820 (corresponding to a zero power level). This provides a very close estimate of $I_{th}$ to which a value for $I_{offset}$ can be added to determine $I_0$ in accordance with Eqn. 5 described above. For example, the user determined default value for $I_{offset}$ can be used. Additionally, the data model of temperature (T) versus $I_{th}$ (e.g., FIG. 4 or 7(*e*)) can be used to generate $I_{th}$ values for each temperature. This can be further used with $I_{offset}$ values to generate $I_0$ values for each temperature. These $I_0$ values are used to set a bottom end bias current value for the laser at each temperature.

Embodiments of the invention adjust the bias current to adjust the power lever in order to accomplish temperature compensation (Step 809). Both open loop and closed loop implementations can be used to effect temperature compensation. In a closed loop implementation the optical output power of the laser can be monitored and adjusted to obtain the desired laser power (qOPL) for the appropriate temperature. Once these values are calculated and stored, a temperature measurement is made and the appropriate modulation current is accessed and then input into the laser to obtain the desired power.

Additionally, in an open loop implementation an appropriate temperature dependent laser driving current (e.g., $I_0$ and $I_1$) can be pre-calculated using the measured SE values for the tested laser, calculated qOPL's, $I_0$, and $I_{th}$ values. For example, one open-loop implementation is described as follows. At one temperature, at two different laser bias currents (currents above $I_{th}$), optical power levels are measured. These measurements can be used to determine slope efficiency (SE) and $I_{th}$. These values for SE and $I_{th}$, in conjunction with the data models (SE v. T and $I_{th}$ v. T), can be used to determine SE and $I_{th}$ across the entire range of temperatures. A predetermined $I_{offset}$ value is added to the $I_{th}$ values to generate $I_0$ values across the entire range of temperatures. An ROPV and W can be used to calculate qOPV over the entire range of temperatures. Additionally, $I_1$ can be determined at each temperature. For example, $I_1$ can be determined at one selected temperature Ti as follows:

$$I_{1\_at\_Ti} = \frac{2qOPL_{at\_Ti}}{SE_{at\_Ti}} + 2I_{th\_at\_Ti} - I_{0\_at\_Ti} \qquad \text{Eqn. 9}$$

Once these values are calculated and stored, a temperature measurement is made and the appropriate driving current is accessed and then input into the laser to obtain the desired power.

Figure 9A:
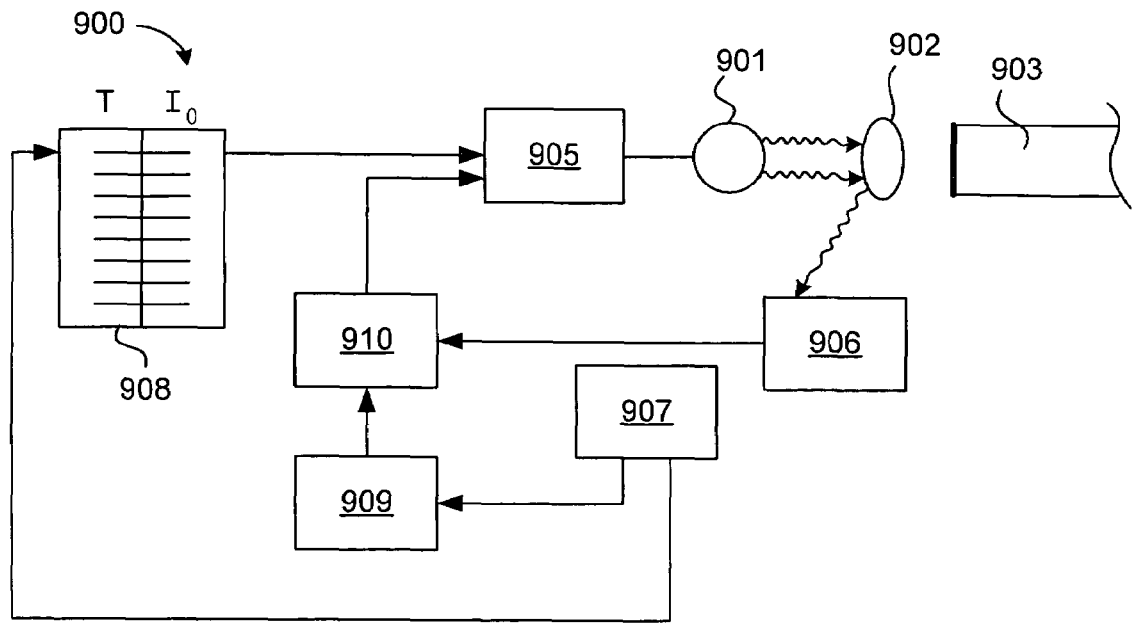
FIGS. 9(a) and 9(b) are fiber optic link embodiments constructed in accordance with the principles of the invention.

FIGS. 9(*a*) and 9(*b*) are simplified block diagrams illustrating two different apparatus embodiments suitable for accomplishing trim and compensation in accordance with the principles of the invention.

FIG. 9(*a*) is a block diagram of a closed loop laser apparatus 900. The apparatus includes a semiconductor laser 901 (e.g., a VCSEL type laser, side emitting diode laser, or other related device) coupled to an optical fiber 903. Typically, a lens element 902 is used to improve the power transmission into the fiber. Electronic driver circuitry 905 is used to drive the laser 901. A monitoring element 906 (typically, a diode device) is used to detect optical power produced by the laser 901 and generate an associated output signal. Additionally, a temperature sensor 907 is used to detect the laser 901 temperature. A temperature compensation table 908 is provided. Electronic circuitry for determining a suitable qualified optical power level (qOPL) and generating an associated output signal is provided. This circuitry is referred to herein as operational power circuitry 909 which produces an operational power output signal. Temperature compensation circuitry 910 is receives signal from the monitoring element 906 and from circuitry 909 (in the form of operational power output signals), compensation circuitry 910 adjusts the modulation current provided to the laser 901 to accommodate the changing temperature conditions.

The temperature comparison table 908 can be generated using the previously described $I_{th}$ v. temperature models. A value for $I_{offset}$ can added to the modeled $I_{th}$ values at each temperature to generate values for $I_0$ which are stored in the table 908. Alternatively, the $I_{th}$ v. temperature model can be stored and the table 908 can incorporate a sub-routine for generating $I_0$ values as needed.

The operational power circuitry 909 for determining a suitable qualified optical power level (qOPL) can include a table that stores the previously determined qualified optical power level (qOPL) values for each temperature. Alternatively, the data models can be stored and the circuitry 909 can incorporate a sub-routine for generating qOPL values as needed.

In general, the apparatus functions as follows. Once the laser 901 and fiber 903 are coupled and initial measurement of the laser are made, the table 908 can be generated and the qOPL values can be generated. The temperature is then determined using temperature sensor 907. An associated signal sent from the temperature sensor 907 to the table 908. The table is consulted and a suitable 10 value is determined. This value is received by the laser driver 905 where it can be used to provide a logical low value for bias current. Additionally, a temperature signal is sent from the temperature sensor 907 to the circuitry 909 for determining a suitable qualified optical power level (qOPL). Circuitry 909 determines the qOPL value associated with the temperature. A signal corresponding to the designated qOPL value is sent to the temperature compensation circuitry 910.

Contemporaneously, the monitoring element 906 measures optical power produced by the laser 901 and provides an associated signal to the temperature compensation circuitry 910. The monitor signal from the monitoring element 906 and the operational power signal from the circuitry 909 are both received by the temperature compensation circuitry 910. The temperature compensation circuitry 910 processes both signals to determine whether the current should be increased or decreased to achieve the desired qOPL for the present temperature. The required bias current is then provided to the laser driver circuitry 905 which supplies the requisite bias current to the laser 901. This process is repeated as the temperature and power of the laser change thereby achieving temperature dependent power compensation.

Figure 9B:
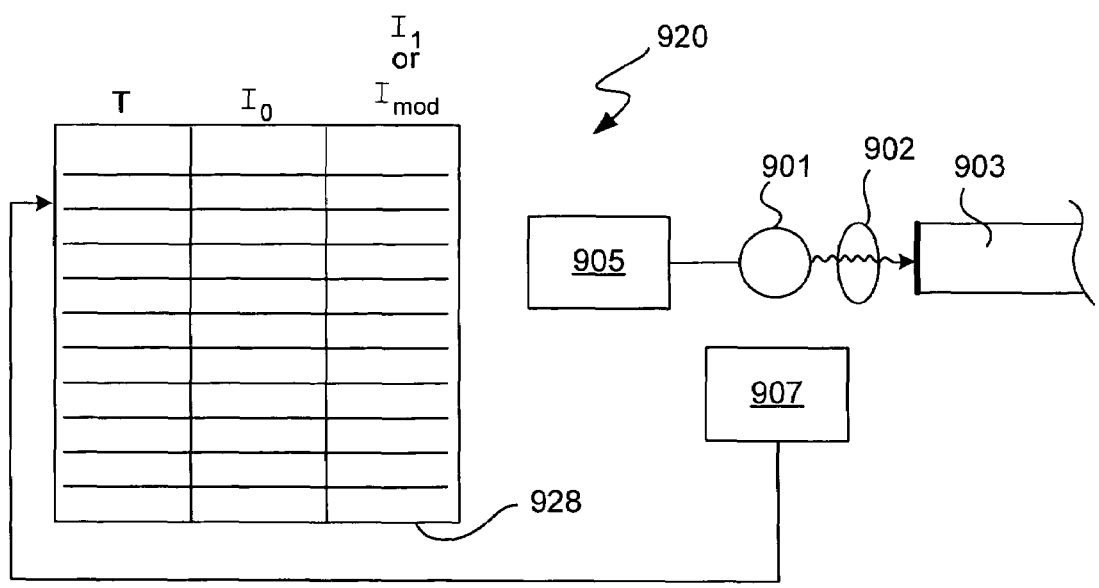

Another approach utilizes the open loop apparatus 920 depicted in FIG. 9(b). FIG. 9(b) is a block diagram of an open loop laser apparatus 920. The apparatus 920 includes a semiconductor laser 901 (e.g., a VCSEL type laser, side emitting diode laser, or other related device) coupled to an optical fiber 903. Typically, a lens element 902 is used to improve the power transmission into the fiber. Electronic driver circuitry 905 is used to drive the laser 901. Additionally, a temperature sensor 907 is used to detect the laser 901 temperature. A temperature compensation table 928 is provided. The temperature compensation table includes a table of temperatures (T) and associated tables of values for $I_0$ and $I_{mod}$ (or $I_1$) that are referenced to temperature. These tables can be generated using the measured SE value for the laser (901) and the data models. Methods of generating such tables have been explained elsewhere in this patent. Each of the aforementioned values can be stored in the table 928. The temperature is determined using the temperature sensor 907 which produces an associated signal which can be used in conjunction with the table 928 to determine an appropriate modulation current that will produce that desired laser output power.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method of determining a range of qualified optical power levels for a laser emitter in a fiber optic link that couples the laser emitter to an optical fiber, the method comprising:

providing a laser emitter;

determining a reference optical power value for the laser emitter wherein determining the reference optical power value for the laser emitter includes:

calculating reference optical power value from previously determined laser performance information derived from a sample population of lasers that are substantially similar to the provided laser emitter, using previously determined coupling efficiency information concerning the coupling efficiency of a sample population of lasers that are substantially similar to the provided laser emitter and a fiber optic link, and using a predetermined set of user specified performance parameters that include at least one of:

a predetermined extinction ratio, a predetermined temperature dependent power range window (W) wherein the predetermined temperature dependent power range window (W) is adjusted to control at least one of an operational lifetime of the laser emitter, a production yield of the laser emitters, and optical link performance or;

a predetermined offset current value ($I_{offset}$), a predetermined quantization error for the offset current value ($I_{offset}$), and a predetermined operational temperature range;

measuring the performance of the provided laser emitter; and determining the range of qualified optical power levels for the provided laser emitter by modifying the reference target operating power using the measurements of the provided laser.

2. A method as in claim 1 wherein the predetermined temperature dependent power range window (W) is adjusted to control the operational lifetime of the laser emitter.

3. A method of determining a range of acceptable optical power levels for a laser emitter in a fiber optic link that couples the laser emitter to an optical fiber, the method comprising:

providing a laser emitter;

determining a reference optical power value for the laser emitter by calculating reference optical power value from:

previously determined laser performance information derived from a sample population of lasers that are substantially similar to the provided laser emitter including data models of laser performance over a range of temperatures for a population of lasers that are substantially similar to that of the provided laser emitter and include at least one of:
a predetermined extinction ratio,
a predetermined temperature dependent power range window (W) wherein one of the data models of laser performance incorporates a predetermined temperature dependent power range window (W) and wherein the predetermined temperature dependent power range window (W) is adjusted to control at least one of an operational lifetime of the laser emitter, a production yield of the laser emitters, and optical link performance or;
a predetermined offset current value ($I_{offset}$),
a predetermined quantization error for the offset current value ($I_{offset}$), and
a predetermined operational temperature range;
measuring the performance of the provided laser emitter; and
determining the range of qualified optical power levels for the provided laser emitter by modifying the reference target operating power using the measurements of the provided laser.

4. A method as in claim 3 wherein one of the data models of laser performance incorporates a predetermined temperature dependent power range window (W) and wherein the predetermined temperature dependent power range window (W) is adjusted to control the operational lifetime of the laser emitter.

5. A method of determining a range of acceptable optical power levels for a laser emitter in a fiber optic link that couples the laser emitter to an optical fiber, the method comprising:
providing a laser emitter;
determining a reference optical power value for the laser emitter by calculating reference optical power value from:
previously determined laser performance information derived from a sample population of lasers that are substantially similar to the provided laser emitter including data models of laser performance over a range of temperatures for a population of lasers that are substantially similar to that of the provided laser emitter and include at least one of:
a predetermined extinction ratio,
a predetermined temperature dependent power range window (W),
a predetermined offset current value ($I_{offset}$),
a predetermined quantization error for the offset current value ($I_{offset}$) or,
wherein the data models of laser performance over a range of temperatures include a first data model that characterizes laser performance in terms of a relationship between threshold current and temperature for a population of laser transmitter devices that is substantially similar to that of the provided laser emitter and includes a second data model that characterizes laser performance in terms of a relationship between slope efficiency and temperature for a population of laser transmitter devices that is substantially similar to that of the provided laser emitter
a predetermined operational temperature range; and
previously determined coupling efficiency information concerning the coupling efficiency of a sample population of lasers that are substantially similar to the provided laser emitter and a fiber optic link, and a predetermined set of user specified performance parameters measuring the performance of the provided laser emitter wherein measuring the performance of the provided laser emitter includes measuring a slope efficiency for the provided laser emitter; and
determining the range of qualified optical power levels for the provided laser emitter by modifying the reference target operating power using the measurements of the provided laser;
wherein determining the range of qualified optical power levels for the provided laser emitter includes:
determining a best case slope efficiency from the second data model that takes into account a best case coupling efficiency obtained from the coupling efficiency information;
modifying the best case slope efficiency with the measuring a slope efficiency of the provided laser emitter to calculate a first qualified optical power level; and
determining a range of qualified optical power levels by using a predetermined power window and the first qualified optical power level.

6. A method of determining a reference optical power value for a laser emitter to be coupled in a fiber optic link that couples the laser emitter with an optical fiber, the method comprising:
providing laser performance information derived from a population of lasers that are similar to said laser emitter, and wherein the laser performance information includes data models of laser performance that describe laser performance over a range of temperatures wherein the data models of laser performance include a first data model that characterizes laser performance in terms of a relationship between threshold current and temperature;
providing coupling efficiency information concerning the coupling efficiency of the population of lasers with a fiber optic link that is similar to said fiber optic link;
providing a predetermined set of user specified performance parameters that include at least one of a predetermined extinction ratio; a predetermined temperature dependent power window (W), a predetermined offset current value ($I_{offset}$), a predetermined quantization error for the offset current value ($I_{offset}$), and a predetermined operational temperature range or;
calculating a reference optical power value that incorporates said laser performance information, said coupling efficiency information, and said performance parameters;
wherein providing the predetermined set of user specified performance parameters includes:
providing a predetermined extinction ratio; a temperature dependent power window, and a default value for an offset current value ($I_{offset}$);
wherein calculating the reference optical power value includes:
determining a best case effective slope efficiency at a low temperature using a best case slope efficiency at a low end of the temperature range and modifying that value with the best case coupling efficiency;
determining a best case effective slope efficiency at a high temperature using a best case slope efficiency at a high end of the temperature range and modifying that value with the best case coupling efficiency;
determining a worst case effective offset current at a low temperature determined at a low end of the temperature range;

determining a worst case effective offset current at a high temperature determined at a high end of the temperature range; and determining the reference optical power value using the best case effective slope efficiency at low temperature, the best case effective slope efficiency at high temperature, the worst case effective offset current at low temperature, the worst case effective offset current at high temperature, the predetermined extinction ratio, and the temperature dependent power window.

7. A method as in claim 6 wherein the data models of laser performance include a second data model that characterizes laser performance in terms of a relationship between slope efficiency and temperature.

8. A method as in claim 6 wherein the predetermined temperature dependent power range window (W) is adjusted to control the operational lifetime of the laser emitter.

9. A method as in claim 6 wherein the predetermined temperature dependent power range window (W) is adjusted to control at least one of an operational lifetime of the laser emitter, a production yield of the laser emitters, and optical link performance.

10. The method of claim 6 wherein determining a best case effective slope efficiency at low temperature comprises:
   determining a best case slope efficiency at a low temperature from the second data model that characterizes laser performance in terms of the relationship between slope efficiency and temperature;
   determining a best case coupling efficiency using the provided coupling efficiency information;
   modifying the best case slope efficiency at a low temperature using the best case coupling efficiency to determine a best case effective slope efficiency at low temperature;
   wherein determining a best case effective slope efficiency at high temperature comprises
   determining a best case slope efficiency at a high temperature from the second data model that characterizes laser performance in terms of the relationship between slope efficiency and temperature;
   modifying the best case slope efficiency at a high temperature using the best case coupling efficiency to determine a best case effective slope efficiency at high temperature;
   wherein determining a worst case effective offset current at low temperature comprises:
   determining an initial estimate of a worst case threshold current using the first data model that characterizes laser performance in terms of the relationship between threshold current and temperature;
   determining an estimate of a zero bias current using the initial estimate of worst case threshold current and the default offset current value;
   determining a low temperature error margin at a low temperature of the first data model;
   implementing the low temperature error margin to determine a second estimate of threshold current at low temperature; and
   calculating the worst case effective offset current at low temperature using the estimate of a zero bias current and the second estimate of threshold current at low temperature;
   wherein determining a worst case effective offset current at high temperature comprises:
   determining an initial estimate of a worst case threshold current using the first data model that characterizes laser performance in terms of the relationship between threshold current and temperature;
   determining an estimate of a zero bias current using the initial estimate of worst case threshold current and the default offset current value;
   determining a high temperature error margin at a high temperature of the first data model;
   implementing the high temperature error margin to determine a third estimate of threshold current at high temperature; and
   calculating the worst case effective offset current at high temperature using the estimate of a zero bias current and the third estimate of threshold current at high temperature;
   wherein determining the reference optical power value comprises:
   determining a first estimate of reference optical power value using the predetermined extinction ratio, the worst case effective offset current at low temperature, and the best case effective slope efficiency at low temperature;
   determining a second estimate of reference optical power value using the predetermined extinction ratio, the worst case effective offset current at high temperature, and the best case effective slope efficiency at high temperature; and the predetermined temperature dependent power window (W); and
   comparing the first estimate of reference optical power value and the second estimate of reference optical power value to determine the of reference optical power value.

* * * * *